United States Patent
Kim et al.

(10) Patent No.: US 10,872,931 B2
(45) Date of Patent: Dec. 22, 2020

(54) COLOR CONVERSION PANEL AND DISPLAY DEVICE INCLUDING THE SAME

(71) Applicant: Samsung Display Co., Ltd., Yongin-si (KR)

(72) Inventors: Soodong Kim, Hwaseong-si (KR); Kyoungwon Park, Seoul (KR); Sungwoon Kim, Yongin-si (KR); Jangwi Ryu, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/224,635

(22) Filed: Dec. 18, 2018

(65) Prior Publication Data
US 2019/0296088 A1    Sep. 26, 2019

(30) Foreign Application Priority Data
Mar. 20, 2018    (KR) .......................... 10-2018-0031916

(51) Int. Cl.
*H01L 27/32*    (2006.01)
*H01L 51/52*    (2006.01)

(52) U.S. Cl.
CPC ........ *H01L 27/322* (2013.01); *H01L 27/3244* (2013.01); *H01L 51/5268* (2013.01); *H01L 51/5284* (2013.01)

(58) Field of Classification Search
None
See application file for complete search history.

(56) References Cited

U.S. PATENT DOCUMENTS

| 2007/0200492 A1* | 8/2007 | Cok ...................... H01L 27/322 |
| | | 313/506 |
| 2017/0076678 A1* | 3/2017 | Lee ................... G02F 1/133512 |
| 2017/0141162 A1 | 5/2017 | Kim et al. |
| 2018/0006093 A1 | 1/2018 | Kim et al. |

FOREIGN PATENT DOCUMENTS

| KR | 10-2017-0096583 | 8/2017 |
| KR | 10-1809259 | 12/2017 |
| KR | 10-2018-0002933 | 1/2018 |

* cited by examiner

*Primary Examiner* — Robert K Carpenter
(74) *Attorney, Agent, or Firm* — H.C. Park & Associates, PLC

(57) ABSTRACT

A color conversion panel includes: a substrate including a light blocking area and first, second, and third transmission areas; a first color filter disposed on the substrate at the first transmission area; a second color filter disposed on the substrate at the second transmission area; a low refractive index layer disposed on the substrate at the light blocking area and the first, second, and third transmission areas; a first color conversion layer disposed on the first color filter and the low refractive index layer; a second color conversion layer disposed on the second color filter and the low refractive index layer; and a light transmitting layer disposed on the low refractive index layer at the third transmission area. The low refractive index layer has a refractive index lower than a refractive index of the first color conversion layer and a refractive index of the second color conversion layer.

20 Claims, 11 Drawing Sheets

COLOR CONVERSION PANEL AND DISPLAY DEVICE INCLUDING THE SAME

CROSS-REFERENCE TO RELATED APPLICATION

This application claims priority from and the benefit of Korean Patent Application No. 10-2018-0031916, filed on Mar. 20, 2018, which is hereby incorporated by reference for all purposes as if fully set forth herein.

BACKGROUND

Field

Exemplary embodiments of the invention relate generally to a color conversion panel and a display device including the color conversion panel.

Discussion of the Background

Display devices are classified into a liquid crystal display ("LCD") device, an organic light emitting diode ("OLED") display device, a plasma display panel ("PDP") device, an electrophoretic display ("EPD") device, or the like, based on a light emitting scheme thereof.

Among those types of display devices, OLED display devices are garnering attention as an ideal next generation display device because they have excellent display characteristics in terms of a contrast ratio and a response time, and are advantageous in implementing a flexible display device. Such OLED display devices may include a color filter, a color conversion layer, or the like.

The above information disclosed in this Background section is only for understanding of the background of the inventive concepts, and, therefore, it may contain information that does not constitute prior art.

SUMMARY

Exemplary embodiments of the present invention may be directed to a color conversion panel capable of improving the display quality and to a display device including the color conversion panel.

Additional features of the inventive concepts will be set forth in the description which follows, and in part will be apparent from the description, or may be learned by practice of the inventive concepts.

According to an exemplary embodiment of the present invention, a color conversion panel includes: a substrate including a light blocking area and first, second, and third transmission areas; a first color filter disposed on the substrate at the first transmission area; a second color filter disposed on the substrate at the second transmission area; a low refractive index layer disposed on the substrate at the light blocking area and the first, second, and third transmission areas; a first color conversion layer disposed on the first color filter and the low refractive index layer; a second color conversion layer disposed on the second color filter and the low refractive index layer; and a light transmitting layer disposed on the low refractive index layer at the third transmission area. The low refractive index layer has a refractive index less than a refractive index of the first color conversion layer and a refractive index of the second color conversion layer.

The low refractive index layer may have a refractive index in the range from about 1.1 to about 1.3.

An area of the first transmission area may be less than an area of the second transmission area and larger than an area of the third transmission area.

The first color filter may be a red color filter, the second color filters may be a green color filter, and each of the first and second color conversion layers may include phosphors and scattering elements.

The second color conversion layer may include less amount of scattering elements than an amount of the scattering elements included in the first color conversion layer.

The second color conversion layer may include: phosphors in the amount ranging from about 40 wt % to about 55 wt % with respect to the total weight of the second color conversion layer; and scattering elements in the amount ranging from about 2 wt % to about 7 wt % with respect to the total weight of the second color conversion layer.

The first color filter may have a transmittance higher than a transmittance of the second color filter.

The first color filter may have a transmittance in the range from about 75% to about 95%, and the second color filter may have a transmittance in the range from about 65% to about 75%.

The first color filter may have a thickness less than a thickness of the second color filter.

The thickness of the low refractive index layer in the first transmission area may be greater than the thickness of the low refractive index layer in the second transmission area and less than the thickness of the low refractive index layer in the third transmission area.

The light transmitting layer may further include scattering elements.

The light transmitting layer may further include a blue pigment.

The color conversion panel may further include an inorganic layer disposed between the low refractive index layer and the first and second color conversion layers.

The light transmitting layer may cover the first and second color conversion layers.

The color conversion panel may further include a light blocking layer disposed on the substrate at the blocking area. At least a part of the first and second color filters may overlap the light blocking layer.

According to an exemplary embodiment of the present invention, a display device includes: a display panel; and a color conversion panel overlapping the display panel. The color conversion panel includes: a substrate including a light blocking area and first, second, and third transmission areas; a first color filter disposed on the substrate at the first transmission area; a second color filter disposed on the substrate at the second transmission area; a low refractive index layer disposed on the substrate at the light blocking area and the first, second, and third transmission areas; a first color conversion layer disposed on the first color filter and the low refractive index layer; a second color conversion layer disposed on the second color filter and the low refractive index layer; and a light transmitting layer disposed on the low refractive index layer at the third transmission area. The low refractive index layer has a refractive index less than a refractive index of the first color conversion layer and a refractive index of the second color conversion layer.

The display panel may include an organic light emitting element. The organic light emitting element may include: a first electrode; an organic light emitting layer disposed on the first electrode and emitting blue light; and a second electrode disposed on the organic light emitting layer.

According to an exemplary embodiment of the present invention, a display device includes: a substrate including a light blocking area and first, second, and third transmission areas; organic light emitting elements disposed on the substrate at each of the first, second, and third transmission areas; a thin film encapsulation layer disposed on the organic light emitting element; a first color conversion layer disposed on the thin film encapsulation layer at the first transmission area; a second color conversion layer disposed on the thin film encapsulation layer at the second transmission area; a light transmitting layer disposed on the thin film encapsulation layer at the third transmission area; a low refractive index layer disposed on the first color conversion layer, the second color conversion layer, and the light transmitting layer; a first color filter disposed on the first color conversion layer and the low refractive index layer; and a second color filter disposed on the second color conversion layer and the low refractive index layer. The low refractive index layer has a refractive index less than a refractive index of the first color conversion layer and a refractive index of the second color conversion layer.

The low refractive index layer may be disposed between a first inorganic layer and a second inorganic layer.

The light transmitting layer may cover the first and second color conversion layers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
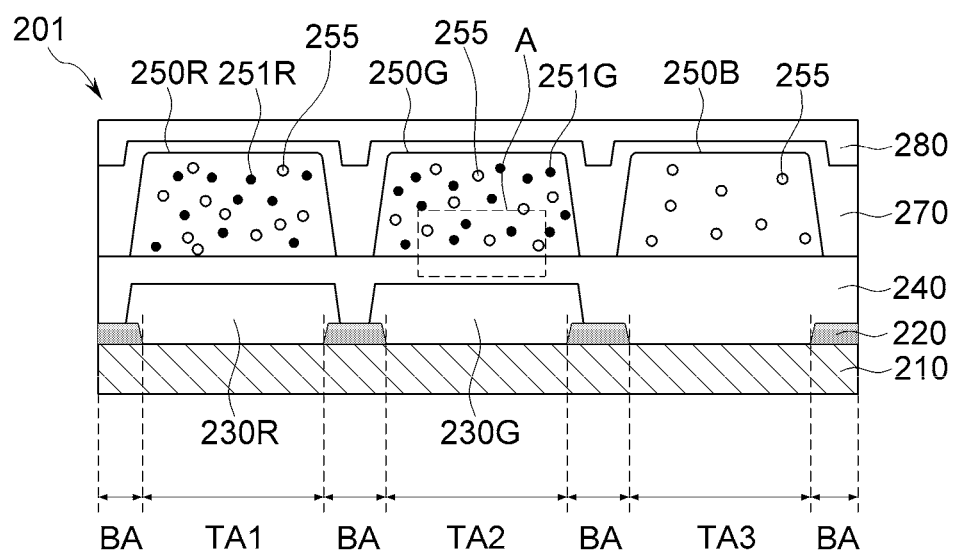
FIG. 1 is a cross-sectional view illustrating a color conversion panel according to an exemplary embodiment of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
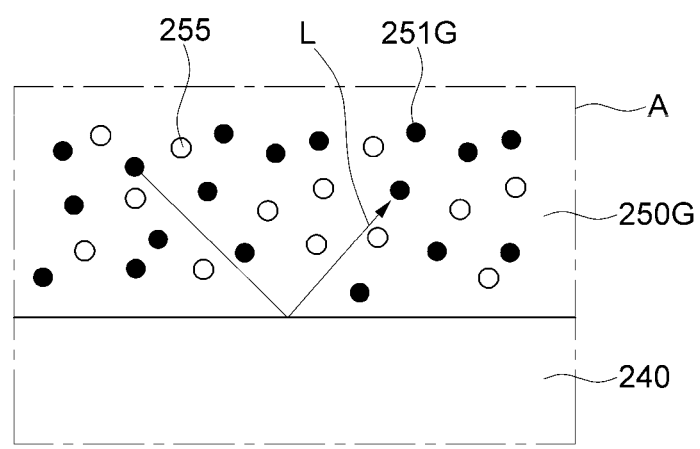
FIG. 2 is a cross-sectional view enlarging area A in FIG. 1.

Hereinafter, a color conversion panel 201 according to an exemplary embodiment of the present invention will be described with reference to FIGS. 1 and 2. FIG. 1 is a cross-sectional view illustrating a color conversion panel 201 according to an exemplary embodiment of the present invention, and FIG. 2 is a cross-sectional view enlarging area A in FIG. 1.

Referring to FIG. 1, a color conversion panel 201 according to an exemplary embodiment of the present invention includes a substrate 210, a light blocking layer 220, first and second color filters 230R and 230G, a low refractive index layer 240, first and second color conversion layers 250R and 250G, a light transmitting layer 250B, an inorganic layer 270, and a planarization layer 280.

The substrate 210 includes a light blocking area BA on which the light blocking layer 220 is disposed, and first, second, and third transmission areas TA1, TA2 and TA3 defined by the light blocking area BA. For example, each of the first, second, and third transmission areas TA1, TA2, and TA3 may be defined as an area enclosed by the light blocking layer 220 on a plane.

The substrate 210 may be a plastic film having flexible characteristics. For example, the substrate 210 may include polyimide. However, exemplary embodiments are not limited thereto, and the substrate 210 may include an insulating material such as glass or quartz. The substrate 110 may include a material selected from materials excellent in mechanical strength, thermal stability, transparency, surface smoothness, ease of handling, and water resistance.

The light blocking layer 220 is disposed on the substrate 210 at the light blocking area BA. The light blocking layer 220 may partition the first, second, and third transmission areas TA1, TA2, and TA3. The light blocking layer 220 substantially prevents light from being emitted to the outside through the light blocking area BA, and may be referred to as a black matrix. The light blocking layer 220 may include a metal such as chromium oxide ($CrO_x$) or an opaque organic layer material.

The first color filter 230R is disposed on the substrate 210 at the first transmission area TA1, and the second color filter 230G is disposed on the substrate 210 at the second transmission area TA2. Each of the first and second color filters 230R and 230G may be disposed at openings of the light blocking layer 220. In addition, at least a part of the first and second color filters 230R and 230G may be disposed on the substrate 210 at the light blocking area BA. That is, edges of the first and second color filters 230R and 230G may be positioned on the light blocking layer 220. In addition, adjacent ones of the first and second color filters 230R and 230G may overlap each other at the blocking area BA. The first and second color filters 230R and 230G may be repeatedly arranged in a substantially horizontal direction on an upper surface of the substrate 210.

Each of the first and second color filters 230R and 230G transmits only light of a specific wavelength band and absorbs light of the remaining wavelength band. Hereinafter, the color conversion panel 201 according to an exemplary embodiment of the present invention will be described on the assumption that the first color filter 230R is a red color filter and the second color filter 230G is a green color filter. That is, the first color filter 230R which is a red color filter may transmit only red light, and the second color filter 230G which is a green color filter may transmit only green light. Accordingly, the color purity of the color conversion panel 201 may be improved.

In addition, since the first and second color filters 230R and 230G absorb most of the external light except red light and green light, the external light to be viewed may be substantially minimized. Accordingly, a polarizer typically provided to prevent reflection of external light may be omitted, and thus defects due to detachment of the polarizer may be prevented, and the power consumption may be reduced.

The first color filter 230R according to an exemplary embodiment of the present invention may have a transmittance higher than that of the second color filter 230G. For example, when the first and second color filters 230R and 230G have the same thickness, the first color filter 230R may have a transmittance in the range from about 75% to about 95%, and the second color filter 230G may have a transmittance in the range from about 65% to about 75%. Accordingly, the external light reflectance in the first transmission area TA1 at which the first color filter 230R is disposed may be higher than the external light reflectance in the second transmission area TA2 at which the second color filter 230G is disposed. That is, the first transmission area TA1 at which the red color filter is disposed may have an external light reflectance higher than that of the second transmission area TA2 at which the green color filter is disposed, the effect of which will be described in detail below.

The low refractive index layer 240 is disposed on the substrate 210 at the light blocking area BA and the first, second, and third transmission areas TA1, TA2 and TA3. That is, the low refractive index layer 240 may be disposed over the entire surface of the substrate 210, and may cover the first and second color filters 230R and 230G.

The low refractive index layer 240 may include a transparent organic material having a refractive index lower than those of the first and second color filters 230R and 230G. For example, the low refractive index layer 240 may have a refractive index in the range from about 1.1 to about 1.3. In addition, the low refractive index layer 240 may have a refractive index less than those of the first and second color conversion layers 250R and 250G to be described below and the light transmitting layer 250B. Accordingly, the color conversion efficiency of the color conversion panel 201 may be improved, which will be described in detail below.

The first color conversion layer 250R is disposed on the first color filter 230R and the low refractive index layer 240, and the second color conversion layer 250G is disposed on the second color filter 230G and the low refractive index layer 240. That is, the first color conversion layer 250R is disposed on the substrate 210 at the first transmission area TA1, and the second color conversion layer 250G is disposed on the substrate 210 at the second transmission area TA2. In addition, at least a part of the first and second color conversion layers 250R and 250G may be disposed on the substrate 210 at the light blocking area BA.

The first and second color conversion layers 250R and 250G convert the wavelength of incident light to generate a light having a wavelength different from the wavelength of the incident light. Hereinafter, the color conversion panel 201 according to an exemplary embodiment of the present invention will be described on the assumption that the first color conversion layer 250R is a red color conversion layer for generating red light, and the second color conversion layer 250G is a green conversion layer for generating green light.

Each of the first and second color conversion layers 250R and 250G includes a scattering element 255 and each corresponding one of phosphors (e.g., fluorescent elements) 251R and 251G. Each of the first and second color conversion layers 250R and 250G may include a resin that includes the scattering element 255 and each corresponding one of the phosphors 251R and 251G.

The phosphors 251R and 251G are a substance that emits fluorescence when irradiated with light or radiation, and emits light having a specific wavelength of the phosphors 251R and 251G. In addition, the phosphors 251R and 251G emit light to the entire area regardless of the direction of the incident light. According to an exemplary embodiment of the present invention, quantum dots may be used as the phosphors 251R and 251G. In such an exemplary embodiment, the quantum dot is not limited to a spherical shape, but may have a shape such as a rod, a pyramid, a multi-arm, a cubic nanoparticle, a nanotube, a nanowire, a nanofiber, and a nanoplate.

The quantum dot absorbs light incident thereto and emits light having a different wavelength from a wavelength of the incident light. That is, the quantum dot is a wavelength converting particle that may convert the wavelength of light incident to the quantum dot. A wavelength range of light a quantum dot may convert may vary depending on the size of the quantum dot. For example, by adjusting the diameter of the quantum dot, the quantum dot may emit light of a desired color.

In general, the quantum dot has a high extinction coefficient and a high quantum yield, and emits significantly intense fluorescence. In particular, the quantum dot may absorb light of a short wavelength and may emit light of a longer wavelength. The quantum dot may have a full width of half maximum (FWHM) of the emission wavelength spectrum of about 45 nm or less, preferably about 40 nm or less, more preferably about 30 nm or less, and the color purity or color gamut may be improved in the above range. In addition, since the light emitted through the quantum dots may be emitted toward all directions, a viewing angle may be improved.

The quantum dot may have a structure including a core nanocrystal and a shell nanocrystal surrounding the core nanocrystal. In addition, the quantum dot may include an organic ligand bonded to the shell nanocrystal, or may include an organic coating layer surrounding the shell nanocrystal. The shell nanocrystal may be formed having two or more layers. The shell nanocrystal is placed on the surface of the core nanocrystal. In such an exemplary embodiment, an interface between the core nanocrystal and the shell nanocrystal may have a concentration gradient, that is, the concentration of elements existing in the shell nanocrystal becomes lower toward the center.

The quantum dot may include at least one of: Group II compound semiconductors, Group III compound semiconductors, Group IV compound semiconductors, Group V compound semiconductors, and Group VI compound semiconductors. For example, the quantum dot may be selected from: Group II-VI compounds, Group III-V compounds, Group IV-VI compounds, Group IV elements, Group IV compounds, and combinations thereof.

Specifically, the Group II-VI compound may be selected from the group consisting of: binary compounds of $CdO$, $CdS$, $CdSe$, $CdTe$, $ZnO$, $ZnS$, $ZnSe$, $ZnTe$, $HgS$, $HgSe$, $HgTe$, $MgSe$, $MgS$ and mixtures thereof; ternary compounds of $CdSeS$, $CdSeTe$, $CdSTe$, $ZnSeS$, $ZnSeTe$, $ZnSTe$, $HgSeS$, $HgSeTe$, $HgSTe$, $CdZnS$, $CdZnSe$, $CdZnTe$, $CdHgS$, $CdHgSe$, $CdHgTe$, $HgZnS$, $HgZnSe$, $HgZnTe$, $MgZnSe$, MgZnS, and mixtures thereof; and quaternary compounds of CdZnSeS, CdZnSeTe, CdZnSTe, CdHgSeS, CdHgSeTe, CdHgSTe, HgZnSeS, HgZnSeTe, HgZnSTe, and mixtures thereof. The Group III-V compound may be selected from the group consisting of: binary compounds of GaN, GaP, GaAs, GaSb, AlN, AlP, AlAs, AlSb, InN, InP, InAs, InSb, and mixtures thereof; ternary compounds of GaNP, GaNAs, GaNSb, GaPAs, GaPSb, AlNP, AlNAs, AlNSb, AlPAs, AlPSb, InNP, InNAs, InNSb, InPAs, InPSb, and mixtures thereof; and quaternary compounds of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. The Group IV-VI compound may be selected from the group consisting of: binary compounds of SnS, SnSe, SnTe, PbS, PbSe, PbTe, and mixtures thereof; ternary compounds of SnSeS, SnSeTe, SnSTe, PbSeS, PbSeTe, PbSTe, SnPbS, SnPbSe, SnPbTe, and mixtures thereof; and quaternary compounds of SnPbSSe, SnPbSeTe, SnPbSTe, and mixtures thereof. The Group IV element may be selected from the group consisting of Si, Ge, and mixtures thereof. The Group IV compound may be selected from the group consisting of SiC, SiGe, and mixtures thereof.

In such an exemplary embodiment, the binary compound, the ternary compound, or the quaternary compound may be present in the particle at a uniform concentration, or the concentration distributions thereof may be partially different in the same particle.

Even quantum dots of substantially the same composition may produce different lights depending on their diameters. For example, in the case where the core nanocrystal includes CdSe, blue light may be generated when the diameter of the quantum dots is in the range from about 1 nm to about 3 nm, green light may be generated when the diameter of the quantum dots is in the range from about 3 nm to about 5 nm, and red light may be generated when the diameter of the quantum dots is in the range from about 7 nm to about 10 nm.

According to an exemplary embodiment of the present invention, the first color conversion layer 250R includes a red phosphor 251R that generates red light, and the second color conversion layer 250G includes a green phosphor 251G that generates green light. For example, the red phosphor 251R absorbs blue light to generate red light, and the green phosphor 251G absorbs blue light to generate green light.

The first and second color conversion layers 250R and 250G include different amounts of phosphors 251R and 251G, respectively. In particular, the second color conversion layer 250G includes a larger amount of the phosphor 251G than the amount of the phosphor 251R included in the first color conversion layer 250R. The first color conversion layer 250R includes the phosphor 251R in the amount ranging from about 20 wt % to about 40 wt % with respect to the total weight of the first color conversion layer 250R, and the second color conversion layer 250G includes the phosphor 251G in the amount ranging from about 40 wt % to about 55 wt % with respect to the total weight of the second color conversion layer 250G. For example, the first color conversion layer 250R may include the phosphor 251R in the amount of about 25 wt % with respect to the total weight of the first color conversion layer 250R, and the second color conversion layer 250G may include the phosphor 251G in the amount of about 50 wt % with respect to the total weight of the second color conversion layer 250G.

The scattering element 255 is not particularly limited as long as it is commonly used. For example, the scattering element 255 may include at least one of $TiO_2$, $SiO_2$ or ZnO. The first and second color conversion layers 250R and 250G may include the same scattering elements. However, exemplary embodiments of the present invention are not limited thereto, and each of the first and second color conversion layers 250R and 250G may include different scattering elements.

The scattering element 255 scatters light incident to the first and second color conversion layers 250R and 250G, thereby improving the light conversion efficiency and substantially minimizing color deviation according to the viewing angle. Specifically, the scattering element 255 has a refractive index different from a refractive index of the resin of the first and second color conversion layers 250R and 250G. Accordingly, a light passing through the scattering element 255 of the first and second color conversion layers 250R and 250G is refracted and scattered, thereby improving the light conversion efficiency and reducing the color deviation according to the viewing angle. For example, a difference in refractive index between the resin of the first and second color conversion layers 250R and 250G and the scattering element 255 may be in the range from about 0.01 to about 0.20. However, exemplary embodiments of the present invention are not limited thereto.

The content, size, shape or the like of the scattering element 255 are not particularly limited, and may be appropriately selected in consideration of characteristics of the resin of the first and second color conversion layers 250R and 250G and the incident light. For example, when the scattering element 255 is spherical, the diameter (nm) of the scattering element 255 may be about 0.1 to about 5 times the wavelength (nm) of the incident light, and accordingly, the light scattering efficiency may be improved. In addition, the scattering element 255 may include a core and a shell. When the scattering element 255 includes a core and a shell, the refractive index of the scattering element 255 may be easily adjusted to a desired value.

The first and second color conversion layers 250R and 250G according to an exemplary embodiment of the present invention include different amounts of scattering element 255. In particular, the second color conversion layer 250G includes a less amount of the scattering element 255 than the amount of the scattering element 255 included in the first color conversion layer 250R. The first color conversion layer 250R includes the scattering element 255 in the amount ranging from about 4 wt % to about 15 wt % with respect to the total weight of the first color conversion layer 250R, and the second color conversion layer 250G includes the scattering element 255 in the amount ranging from about 2 wt % to about 7 wt % with respect to the total weight of the second color conversion layer 250G. For example, the first color conversion layer 250R may include the scattering element 255 in the amount of about 11 wt % with respect to the total weight of the first color conversion layer 250R, and the second color conversion layer 250G may include the scattering element 255 in the amount of about 4.5 wt % with respect to the total weight of the second color conversion layer 250G.

The scattering element 255 included in the first and second color conversion layers 250R and 250G may reflect external light to lower the contrast ratio. The second color conversion layer 250G according to an exemplary embodiment of the present invention includes a less amount of the scattering element 255 than the amount of the scattering element 255 included in the first color conversion layer 250R so that the external light reflectance per unit area at the second color conversion layer 250G which is a green color conversion layer may be less than the external light reflectance per unit area at the first color conversion layer 250R which is a red color conversion layer, the effect of which will be described in detail below.

Each of the first and second color conversion layers 250R and 250G has a refractive index higher than a refractive index of the low refractive index layer 240 disposed below the first and second color conversion layers 250R and 250G. For example, each of the first and second color conversion layers 250R and 250G may have a refractive index in the range from about 1.6 to about 1.8, and the low refractive index layer 240 may have a refractive index in the range from about 1.1 to about 1.3. Accordingly, the color conversion efficiency of the color conversion panel 201 may be improved.

For example, referring to FIG. 2, when a light L proceeds from the second color conversion layer 250G having a relatively high refractive index to the low refractive index layer 240 having a relatively low refractive index, the light L may be totally reflected from an interface between the second color conversion layer 250G and the low refractive index layer 240. That is, the light L directed toward the low refractive index layer 240 may be totally reflected and proceed again toward the inside of the second color conversion layer 250G. Accordingly, the path of the light L passing through the second color conversion layer 250G may be lengthened, and the color conversion efficiency may be improved.

Referring again to FIG. 1, the light transmitting layer 250B is disposed on the low refractive index layer 240 at the third transmission area TA3. At least a part of the light transmitting layer 250B may be disposed at the light blocking area BA. The first and second color conversion layers 250R and 250G and the light transmitting layer 250B may be repeatedly disposed in a substantially horizontal direction on the upper surface of the substrate 210. The first and second color conversion layers 250R and 250G and the light transmitting layer 250B may have substantially the same thickness as shown in FIG. 1. However, exemplary embodiments are not limited thereto, and the first and second color conversion layers 250R and 250G and the light transmitting layer 250B may be transformed to have different thicknesses according to the color conversion rate of each of the first and second color conversion layers 250R and 250G and the light transmittance of the light transmitting layer 250B.

The light transmitting layer 250B includes the scattering element 255. The light transmitting layer 250B may include a light transmissive resin including scattering elements. The light transmitting layer 250B may transmit blue light. For example, the light transmitting layer 250B may include a polymer material that transmits blue light. That is, the light transmitting layer 250B may not include a separate phosphor, and may transmit the blue light incident to the light transmitting layer 250B as it is.

The scattering element 255 is not particularly limited as long as it is commonly used. For example, the scattering element 255 may include at least one of $TiO_2$, $SiO_2$ or ZnO. The light transmitting layer 250B may include a scattering element substantially the same as that included in the first and second color conversion layers 250R and 250G. However, exemplary embodiments of the present invention are not limited thereto, and each of the first and second color conversion layers 250R and 250G and the light transmitting layer 250B may include different scattering elements.

The scattering element 255 scatters light incident to the light transmitting layer 250B, thereby increasing the amount of emitted light and substantially minimizing color deviation according to the viewing angle. Specifically, the scattering element 255 has a refractive index different from a refractive index of the resin of the light transmitting layer 250B. Accordingly, the light passing through the scattering element 255 of the light transmitting layer 250B is refracted and scattered, thereby increasing the amount of emitted light and reducing the color deviation according to the viewing angle. For example, the scattering element 255 may have a refractive index in the range from about 1.41 to about 1.60, and a difference in refractive index between the resin of the light transmitting layer 250B and the scattering element 255 may be in the range from about 0.01 to about 0.20. However, exemplary embodiments of the present invention are not limited thereto. In an exemplary embodiment of the present invention, the light transmitting layer 250B may include the scattering element 255 in the amount ranging from about 4 wt % to about 11 wt % with respect to the total weight of the light transmitting layer 250B.

The light transmitting layer 250B further includes a blue pigment. For example, the light transmitting layer 250B may include a blue pigment in the amount ranging from about 1 wt % to about 10 wt % with respect to the total weight of the light transmitting layer 250B. As further including the blue pigment, the light transmitting layer 250B may absorb at least a part of red light and green light included in external light.

The inorganic layer 270 is disposed on the first and second color conversion layers 250R and 250G and the light transmitting layer 250B. For example, the inorganic layer 270 may include silicon nitride ($SiN_x$), silicon oxide ($SiO_2$), silicon oxynitride ($SiO_xN_y$), or the like.

The inorganic layer 270 may substantially prevent the first and second color conversion layers 250R and 250G and the light transmitting layer 250B from being damaged due to the subsequent process after forming the first and second color conversion layers 250R and 250G and the light transmitting layer 250B. Specifically, in the subsequent process after forming the first and second color conversion layers 250R and 250G and the light transmitting layer 250B, the phosphors 251R and 251G or the scattering element 255 in the first and second color conversion layers 250R and 250G and the light transmitting layer 250B may be damaged or quenched by water and high-temperature processes, and the inorganic layer 270 may substantially prevent such a problem. However, the inorganic layer 270 is not invariably necessarily and may be omitted.

The planarization layer 280 may include an organic insulating material. For example, the planarization layer 280 may include acryl, poly (methyl methacrylate) ("PMMA"), benzocyclobutene ("BCB"), polyimide, acrylate, epoxy, polyester, or the like, but exemplary embodiments are not limited thereto.

As the color conversion panel 201 according to an exemplary embodiment of the present invention includes the first and second color conversion layers 250R and 250G which include the phosphors 251R and 251G, respectively, and the light transmitting layer 250B which includes the scattering element 255 and the blue pigment, a wide viewing angle and a wide color gamut may be achieved. In addition, by including the first and second color filters 230R and 230G for absorbing light of a specific wavelength band and including the light transmitting layer 250B which includes the blue pigment, a decrease in the contrast ratio due to external light may be substantially prevented. In addition, as the color conversion panel 201 includes the low refractive index layer 240 disposed over the entire surface of the substrate 210, without including a separate blue color filter, the process of manufacturing the color conversion panel 201 may be simplified.

Hereinafter, a method of manufacturing the color conversion panel 201 according to an exemplary embodiment of the present invention will be described with reference to FIGS. 3A to 3D. FIGS. 3A to 3D are cross-sectional views illustrating a method of manufacturing a color conversion panel 201 according to an exemplary embodiment of the present invention.

Figure 3A:
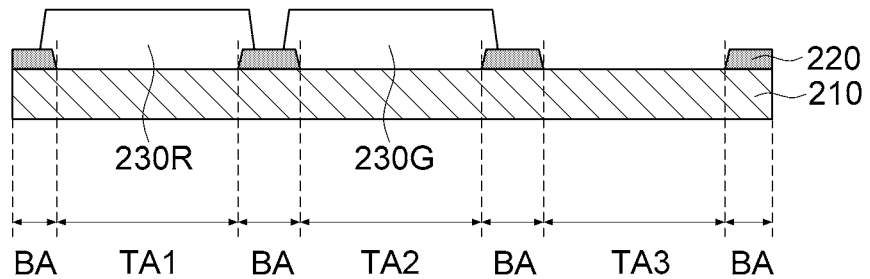
FIGS. 3A, 3B, 3C, and 3D are cross-sectional views illustrating a method of manufacturing a color conversion panel according to an exemplary embodiment of the present invention.

Referring to FIG. 3A, the light blocking layer 220 is formed on the substrate 210 at the light blocking area BA, and the first and second color filters 230R and 230G are formed on the substrate 210 at the first and second transmission areas TA1 and TA2, respectively. In such an exemplary embodiment, edges of the first and second color filters 230R and 230G may be positioned on the light blocking layer 220.

Each of the light blocking layer 220 and the first and second color filters 230R and 230G may be patterned through a photolithography process using a mask. That is, three photolithography processes may be performed to form the light blocking layer 220 and the first and second color filters 230R and 230G.

Figure 3B:
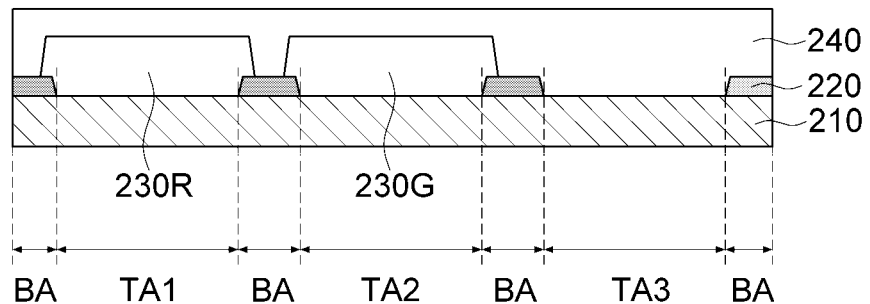

Next, referring to FIG. 3B, the low refractive index layer 240 is formed on the substrate 210 on which the light blocking layer 220 and the first and second color filters 230R and 230G are formed. In such an exemplary embodiment, the low refractive index layer 240 may be disposed over the entire surface of the substrate 210, and may cover the first and second color filters 230R and 230G. Accordingly, a separate process for patterning the low refractive index layer 240 is not required.

Figure 3C:
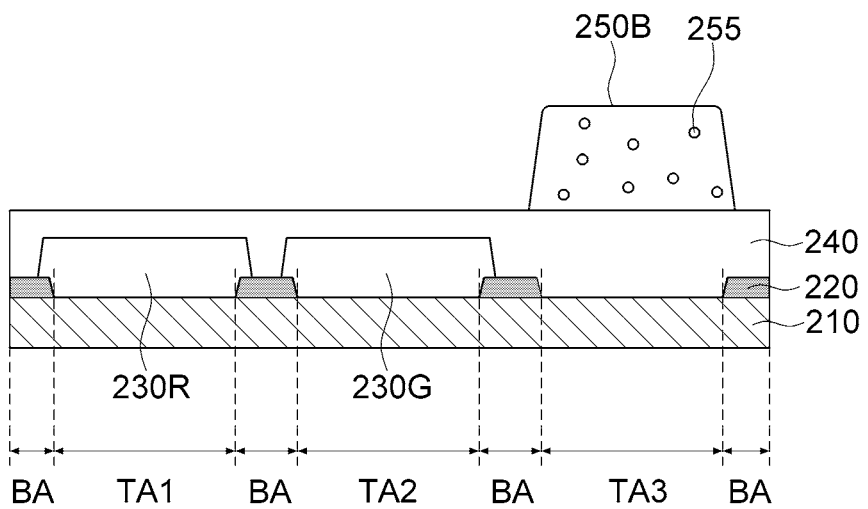

Next, referring to FIG. 3C, the light transmitting layer 250B including the scattering element 255 and the blue pigment is formed on the low refractive index layer 240 at the third transmission area TA3. At least a part of the light transmitting layer 250B may be disposed at the light blocking area BA.

Figure 3D:
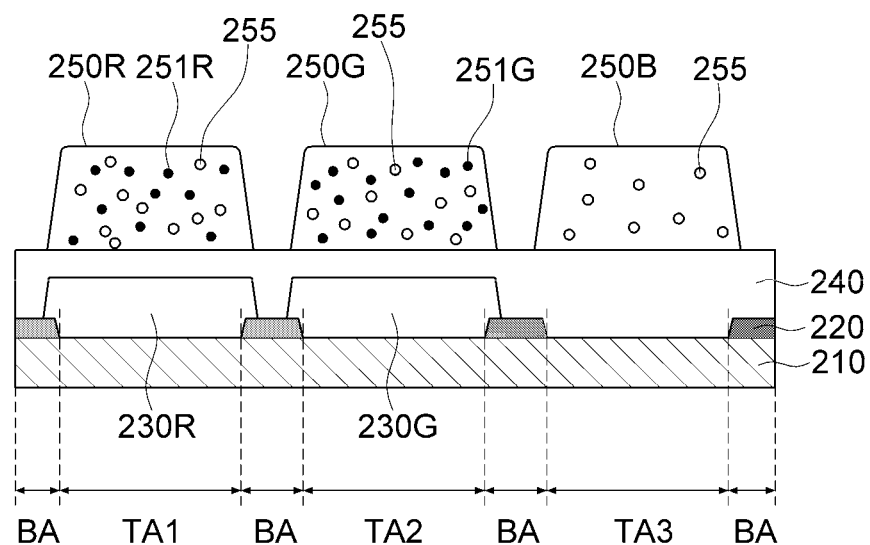

Next, referring to FIG. 3D, the first and second color conversion layers 250R and 250G including the scattering element 255 and each corresponding one of the phosphors 251R and 251G are formed on the low refractive index layer 240 at the first and second transmission areas TA1 and TA2, respectively. At least a part of the first and second color conversion layers 250R and 250G may be disposed at the light blocking area BA.

Each of the light transmitting layer 250B and the first and second color conversion layers 250R and 250G may be patterned through a photolithography process using a mask. That is, three photolithography processes may be further performed to form the light transmitting layer 250B and the first and second color conversion layers 250R and 250G. Accordingly, the process of manufacturing the color conversion panel 201 according to an exemplary embodiment of the present invention may include a total of six photolithography processes.

When the inorganic layer 270 and the planarization layer 280 are then sequentially formed on the substrate 210 so as to cover the light transmitting layer 250B and the first and second color conversion layers 250R and 250G, the color conversion panel 201 as in FIG. 1 may be manufactured.

As the color conversion panel 201 according to an exemplary embodiment of the present invention includes the low refractive index layer 240 disposed over the entire surface of the substrate 210, without including a separate blue color filter, the process of manufacturing the color conversion panel 201 may be simplified.

Figure 4:
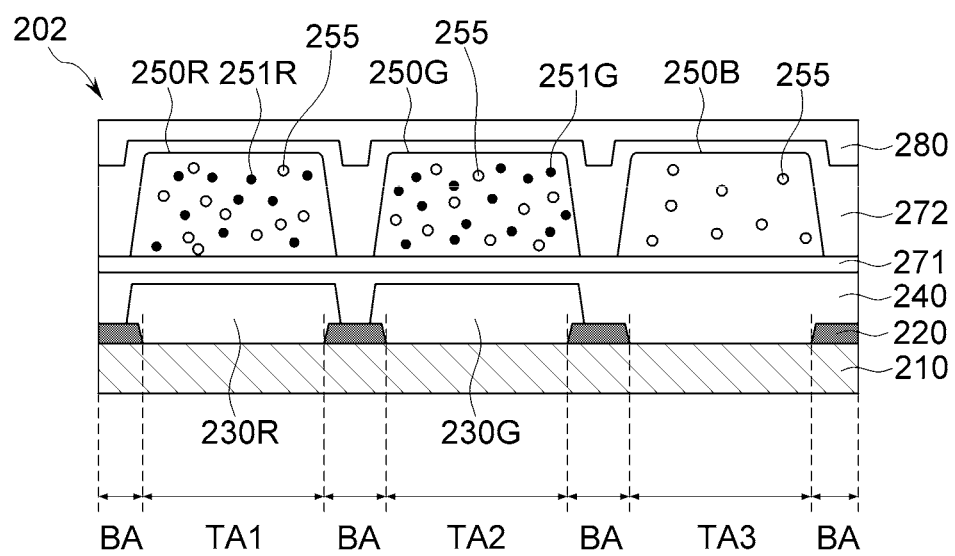
FIG. 4 is a cross-sectional view illustrating a color conversion panel according to another exemplary embodiment of the present invention.

Hereinafter, a color conversion panel 202 according to another exemplary embodiment of the present invention will be described with reference to FIG. 4. The description of the same configuration as that of an exemplary embodiment of the present invention will be omitted for the convenience of explanation. FIG. 4 is a cross-sectional view illustrating a color conversion panel 202 according to another exemplary embodiment of the present invention;

Referring to FIG. 4, a color conversion panel 202 according to another exemplary embodiment of the present invention includes a first inorganic layer 271 and a second inorganic layer 272 with a first color conversion layer 250R, a second color conversion layer 250G, and a light transmitting layer 250B interposed therebetween.

The first inorganic layer 271 is disposed between the low refractive index layer 240 and the first and second color conversion layers 250R and 250G and between a low refractive index layer 240 and the light transmitting layer 250B, and the second inorganic layer 272 is disposed between the first and second color conversion layers 250R and 250G and the planarization layer 280 and between the light transmitting layer 250B and a planarization layer 280. For example, each of the first and second inorganic layers 271 and 272 may include silicon nitride ($SiN_x$), silicon oxide ($SiO_2$), silicon oxynitride ($SiO_xN_y$), or the like.

The first inorganic layer 271 suppresses the penetration of moisture, oxygen or the like between the low refractive index layer 240 including an organic material and each of the first and second color conversion layers 250R and 250G and the light transmitting layer 250B. That is, by disposing the first inorganic layer 271, having a relatively high moisture permeation preventing efficiency as compared with the organic layer, between the low refractive index layer 240 and each of the first and second color conversion layers 250R and 250G and the light transmitting layer 250B, the reliability of the color conversion panel 201 may be improved.

The second inorganic layer 272 may substantially prevent the first and second color conversion layers 250R and 250G and the light transmitting layer 250B from being damaged due to the subsequent process after forming the first and second color conversion layers 250R and 250G and the light transmitting layer 250B. Specifically, in the subsequent process after forming the first and second color conversion layers 250R and 250G and the light transmitting layer 250B, the phosphors 251R and 251G or the scattering element 255 in the first and second color conversion layers 250R and 250G and the light transmitting layer 250B may be damaged or quenched by water and high-temperature processes, and the second inorganic layer 272 may substantially prevent such a problem.

Figure 5:
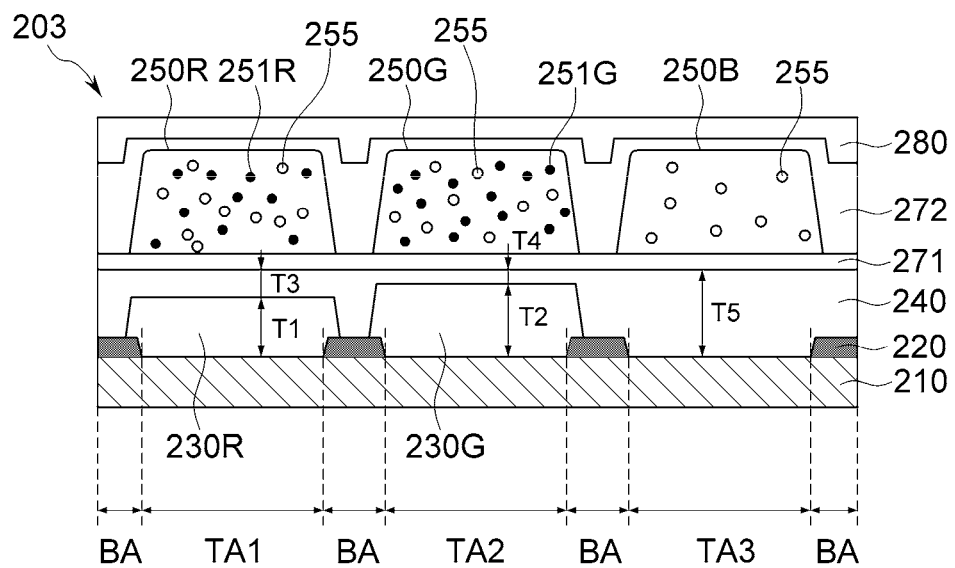
FIG. 5 is a cross-sectional view illustrating a color conversion panel according to still another exemplary embodiment of the present invention.

Hereinafter, a color conversion panel 203 according to still another exemplary embodiment of the present invention will be described with reference to FIG. 5. The description of the same configuration as that of above-described exemplary embodiments of the present invention will be omitted for the convenience of explanation. FIG. 5 is a cross-sectional view illustrating a color conversion panel 203 according to still another exemplary embodiment of the present invention.

Referring to FIG. 5, a color conversion panel 203 according to still another exemplary embodiment of the present invention includes first and second color filters 230R and 230G having different thicknesses.

For example, when the first color filter 230R is a red color filter and the second color filter 230G is a green color filter, the first color filter 230R has a thickness T1 that is less than a thickness T2 of the second color filter 230G. Accordingly, the first color filter 230R may have a relatively high transmittance as compared with that of the second color filter 230G.

The distance from the substrate 210 to an upper surface of the low refractive index layer 240 is substantially the same regardless of the position. However, as the first color filter 230R having a relatively small thickness T1 is disposed between the substrate 210 and the low refractive index layer 240 at the first transmission area TA1, the second color filter 230G having a relatively large thickness T2 is disposed between the substrate 210 and the low refractive index layer 240 at the second transmission area TA2, and no separate color filter is disposed between the substrate 210 and the low refractive index layer 240 at the third transmission area TA3, the low refractive index layer 240 has different thicknesses at the first, second, and third transmission areas TA1, TA2, and TA3.

That is, as illustrated in FIG. 5, a thickness T3 of the low refractive index layer 240 at the first transmission area TA1 is greater than a thickness T4 of the low refractive index layer 240 at the second transmission area TA2, and less than a thickness T5 of the low refractive index layer 240 at the third transmission area TA3.

As the color conversion panel 203 according to still another exemplary embodiment of the present invention includes the first and second color filters 230R and 230G having different thicknesses, the first and second color filters 230R and 230G having different transmittances may be implemented. In particular, the first color filter 230R which is a red color filter may have a transmittance higher than that of the second color filter 230G which is a green color filter.

Figure 6:
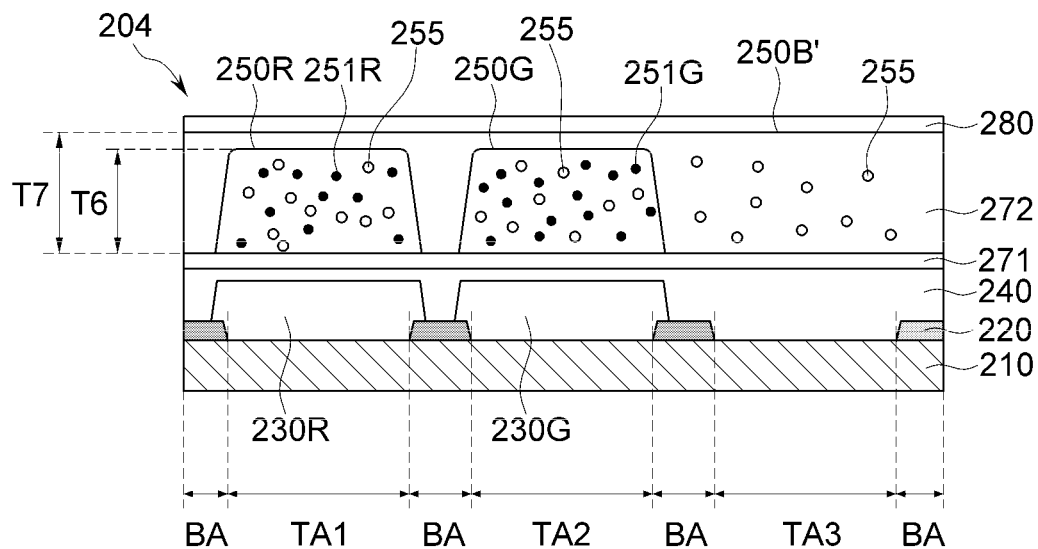
FIG. 6 is a cross-sectional view illustrating a color conversion panel according to still another exemplary embodiment of the present invention.

Hereinafter, a color conversion panel 204 according to still another exemplary embodiment of the present invention will be described with reference to FIG. 6. The description of the same configuration as that of above-described exemplary embodiments of the present invention will be omitted for the convenience of explanation. FIG. 6 is a cross-sectional view illustrating a color conversion panel 204 according to still another exemplary embodiment of the present invention.

Referring to FIG. 6, a color conversion panel 204 according to still another exemplary embodiment of the present invention includes a light transmitting layer 250B' disposed at a light blocking area BA and first, second, and third light transmission areas TA1, TA2, and TA3. That is, the light transmitting layer 250B' may be disposed over the entire surface of a substrate 210, and may cover first and second color conversion layers 250R and 250G.

The light transmitting layer 250B' according to still another exemplary embodiment of the present invention has a thickness T7 that is greater than a thickness T6 of the first and second color conversion layers 250R and 250G, which is different to an exemplary embodiment of the present invention in which the light transmitting layer 250B has the thickness substantially equal to the thickness of the first and second color conversion layers 250R and 250G.

The color conversion panel 204 according to still another exemplary embodiment of the present invention does not require a separate process for patterning the light transmitting layer 250B'. Accordingly, a photolithography process using a mask may be omitted once, and the process of manufacturing the color conversion panel 204 may be simplified.

Hereinafter, a display device 10 according to an exemplary embodiment of the present invention will be described with reference to FIGS. 7 to 11. The description of the same configuration as that of above-described exemplary embodiments of the present invention will be omitted for the convenience of explanation.

Figure 7:
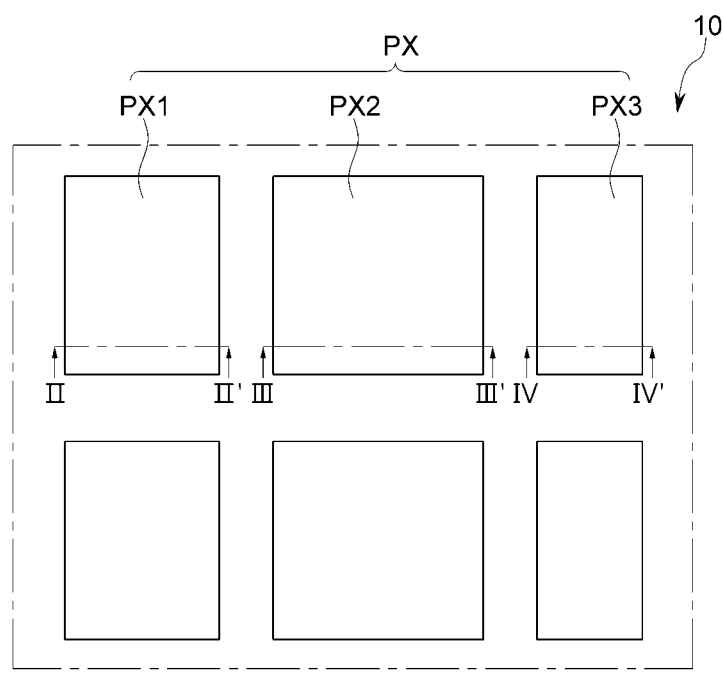
FIG. 7 is a plan view schematically illustrating a plurality of pixels of a display device according to an exemplary embodiment of the present invention.
Figure 8:
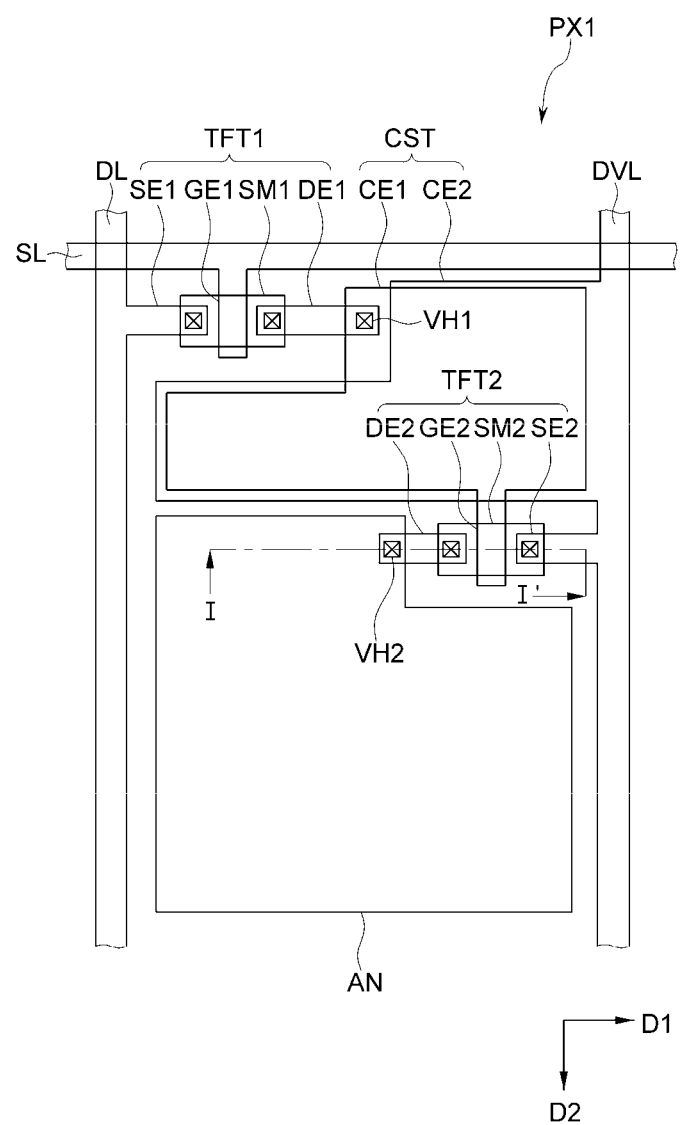
FIG. 8 is a plan view illustrating one pixel in FIG. 7.
Figure 9:
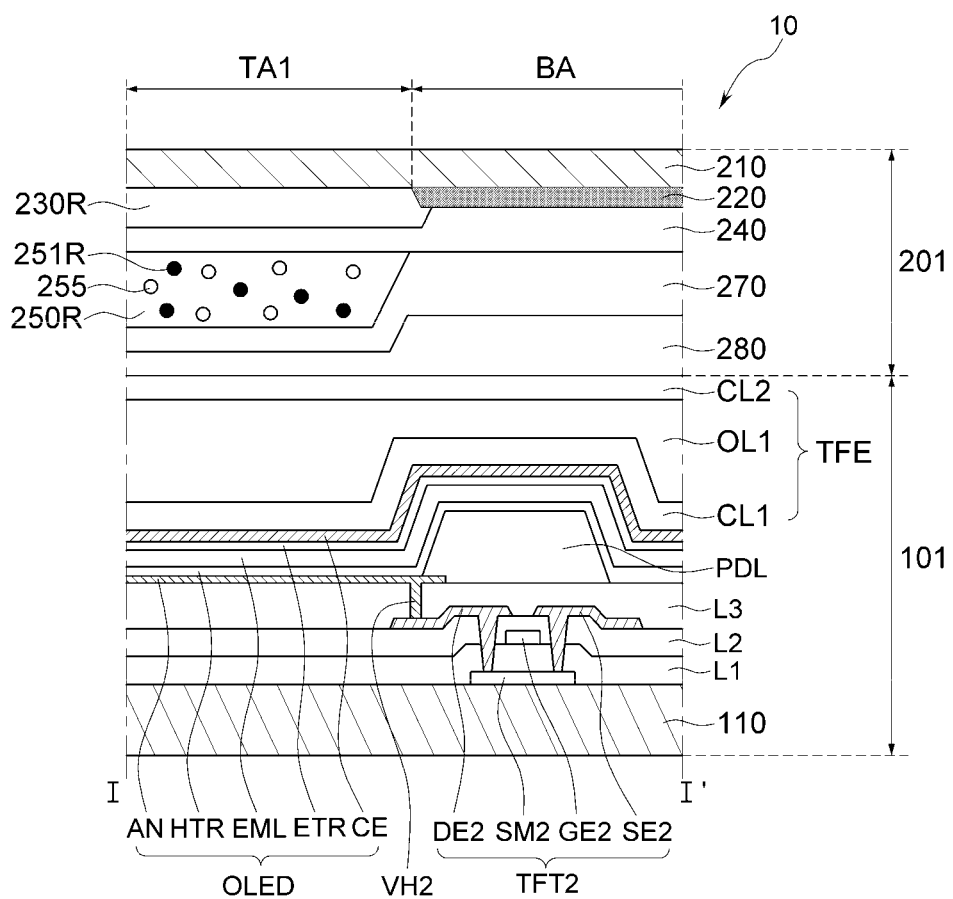
FIG. 9 is a cross-sectional view taken along line I-I' in FIG. 8.

FIG. 7 is a plan view schematically illustrating a plurality of pixels PX1, PX2, and PX3 of a display device 10 according to an exemplary embodiment of the present invention, FIG. 8 is a plan view illustrating one pixel PX1 in FIG. 7, and FIG. 9 is a cross-sectional view taken along line I-I' in FIG. 8.

Referring to FIG. 7, a display device 10 according to an exemplary embodiment of the present invention includes first, second, and third pixels PX1, PX2, and PX3. Each of the pixels PX1, PX2 and PX3 represents a minimum unit for displaying images, and the display device 10 displays images through the plurality of pixels PX1, PX2 and PX3. The display device 10 according to an exemplary embodiment of the present invention will be described on the premise that it is an organic light emitting diode ("OLED") display device in which each pixel PX1, PX2, and PX3 includes an OLED.

The first, second, and third pixels PX1, PX2 and PX3 all include a blue light source. For example, each of the first, second, and third pixels PX1, PX2, and PX3 may include a blue OLED that generates blue light. In addition, each of the first, second, and third pixels PX1, PX2, and PX3 may emit one of red light, green light, and blue light to the outside of the display device 10. Hereinafter, it is assumed that the first pixel PX1 is a red pixel that includes a blue light source and emits red light to the outside, the second pixel PX2 is a green pixel that includes a blue light source and emits green light to the outside, and the third pixel PX3 is a blue pixel that includes a blue light source and emits blue light to the outside. In such an exemplary embodiment, the first pixel PX1 corresponds to the first transmission area TA1 of the color conversion panel 201, the second pixel PX2 corresponds to the second transmission area TA2 of the color conversion panel 201, and the third pixel PX3 corresponds to the third transmission area TA3 of the color conversion panel 201.

According to an exemplary embodiment of the present invention, the area of the first pixel PX1 which is a red pixel is less than the area of the second pixel PX2 which is a green pixel and larger than the area of the third pixel PX3 which is a blue pixel. More specifically, the third pixel PX3 which emits the blue light generated in the display device 10 as it is to the outside has an area less than each area of the first and second pixels PX1 and PX2 which convert the blue light generated in the display device 10 to the red light and the green light, respectively, and emit them to the outside. In general, the color conversion efficiency for converting blue light into green light is less than the color conversion efficiency for converting blue light into red light, and accordingly, the second pixel PX2 that emits green light to the outside has an area larger than an area of the first pixel PX1 that emits red light to the outside.

That is, the light emission area of the first pixel PX1 is less than the light emission area of the second pixel PX2 and larger than the light emission area of the third pixel PX3. Similarly, the area of each of a first color filter 230R and a first color conversion layer 250R of the first pixel PX1 is less than the area of each of a second color filter 230G and a second color conversion layer 250G of the second pixel PX2 and larger than the area of a light transmitting layer 250B of the third pixel PX3.

Referring to FIGS. 8 and 9, a display device 10 according to an exemplary embodiment of the present invention includes a display panel 101 and a color conversion panel 201. The display panel 101 and the color conversion panel 201 may be formed separately and then attached to each other. Although the display device 10 according to an exemplary embodiment of the present invention is shown as including the color conversion panel 201 illustrated in FIG. 1, exemplary embodiments of the present invention are not limited thereto. In an exemplary embodiment, the display device 10 may include the color conversion panels 202, 203, and 204 illustrated in FIGS. 4, 5, and 6.

The display panel 101 includes a substrate 110, a gate line SL, a data line DL, a power signal line DVL, a switching transistor TFT1, a driving transistor TFT2, a storage capacitor CST, and an OLED.

The substrate 110 may be a plastic film having flexible characteristics. For example, the substrate 110 may include polyimide. However, exemplary embodiments are not limited thereto, and the substrate 110 may include an insulating material such as glass or quartz. The substrate 110 may include a material selected from materials excellent in mechanical strength, thermal stability, transparency, surface smoothness, ease of handling, and water resistance.

The gate line SL is disposed on the substrate 110 to transmit a gate signal, and the data line DL is insulated from the gate line SL and is disposed on the substrate 110 to transmit a data signal. The gate line SL may extend in a first direction D1, and the data line DL may extend in a second direction D2 that intersects the first direction D1.

The switching transistor TFT1 is electrically connected to the gate line SL and the data line DL. The switching transistor TFT1 receives the gate signal through the gate line SL, and the switching transistor TFT1 receives the data signal through the data line DL.

The switching transistor TFT1 includes a first semiconductor layer SM1, a first gate electrode GE1, a first source electrode SE1, and a first drain electrode DE1.

The first semiconductor layer SM1 may include a semiconductor material. The first semiconductor layer SM1 may include polycrystalline silicon. However, exemplary embodiments are not limited thereto, and the first semiconductor layer SM1 may include an oxide semiconductor such as IGZO, ZnO, $SnO_2$, $In_2O_3$, $Zn_2SnO_4$, $Ge_2O$, and $HfO_2$. Alternatively, the first semiconductor layer SM1 may include a compound semiconductor such as GsAs, GaP, and InP, or amorphous silicon.

The first gate electrode GE1 is connected to the gate line SL and overlaps the first semiconductor layer SM1. In addition, the first source electrode SE1 is connected to the data line DL to contact a source area of the first semiconductor layer SM1, and the first drain electrode DE1 contacts a drain area of the first semiconductor layer SM1 to be connected to the storage capacitor CST.

The storage capacitor CST includes a first storage electrode CE1 and a second storage electrode CE2, and the first and second storage electrodes CE1 and CE2 overlap each other. The first storage electrode CE1 is connected to the first drain electrode DE1 through a first via hole VH1. In addition, although not illustrated, at least one of a gate insulating layer L1 and an intermediate insulating layer L2 may be interposed between the first and second storage electrodes CE1 and CE2.

The first storage electrode CE1 is connected to the first drain electrode DE1, and the second storage electrode CE2 is connected to the power signal line DVL. Accordingly, the storage capacitor CST stores electric charges corresponding to a difference between a voltage corresponding to the data signal received from the switching transistor TFT1 and a voltage corresponding to the power signal received from the power signal line DVL, and the electric charges may be delivered to the driving transistor TFT2 while the switching transistor TFT1 is turned off.

The driving transistor TFT2 is connected to the switching transistor TFT1, the power signal line DVL and the OLED, and the driving transistor TFT2 switches the power signal applied from the power signal line DVL to the OLED.

The driving transistor TFT2 includes a second semiconductor layer SM2, a second gate electrode GE2, a second source electrode SE2, and a second drain electrode DE2. The second gate electrode GE2 is connected to the first drain electrode DE1 through the first storage electrode CE1, and the second source electrode SE2 is connected to the power signal line DVL. In addition, the second drain electrode DE2 is connected to the OLED through a second via hole VH2 defined in a cover insulating layer L3.

The gate insulating layer L1 covers the second semiconductor layer SM2, and the intermediate insulating layer L2 is disposed on the gate insulating layer L1 to cover the second gate electrode GE2. The cover insulating layer L3 is disposed on the intermediate insulating layer L2 to cover the second source electrode SE2 and the second drain electrode DE2.

The OLED emits light in response to the power signal provided through the driving transistor TFT2. The OLED includes a first electrode AN, a hole control layer HTR, an organic light emitting layer EML, an electron control layer ETR, and a second electrode CE.

The first electrode AN is disposed on the cover insulating layer L3, and the first electrode AN is connected to the second drain electrode DE2 through the second via hole VH2 defined through the cover insulating layer L3.

The first electrode AN may be a reflective electrode. In such an exemplary embodiment, the first electrode AN may be a metal layer that includes a metal such as Ag, Mg, Al, Pt, Pd, Au, Ni, Nd, Ir, and Cr. In addition, the first electrode AN may further include a metal oxide layer stacked on the metal layer. For example, the first electrode AN may have a two-layer structure such as ITO/Mg and ITO/MgF or a multilayer structure such as ITO/Ag/ITO.

A pixel defining layer PDL is disposed on the cover insulating layer L3. At least a part of the pixel defining layer PDL may be disposed on the first electrode AN. An opening is defined by the pixel defining layer PDL, and the organic light emitting layer EML may contact the first electrode AN through the opening of the pixel defining layer PDL. That is, the opening may be defined as a part of an area above the first electrode AN that does not overlap the pixel defining layer PDL.

The hole control layer HTR may include a hole injecting layer and a hole transporting layer. In addition, the hole control layer HTR may further include at least one of a hole buffer layer and an electron blocking layer.

The hole injecting layer may include a hole injecting material, and the hole injecting material may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), and (polyaniline)/poly(4-styrenesulfonate) (PANI/PSS). However, the type of the hole injecting material is not limited thereto.

The hole injecting layer may further include a charge generating material for improving conductivity of the hole transporting layer HTR. The charge generating material may be a p-type dopant, e.g., one of a quinone derivative, a metal oxide, and a compound including a cyano group, but exemplary embodiments of the present invention are not limited to the aforementioned type of the p-type dopant. For example, according to another exemplary embodiment of the present invention, examples of the p-type dopant may include a quinone derivative such as tetracyanoquinodimethane (TCNQ) and 2,3,5,6-tetrafluoro-tetracyanoquinodimethane (F4-TCNQ) and a metal oxide such as a tungsten oxide and a molybdenum oxide.

The hole transporting layer may include a hole transporting material. The hole transporting material may include, for example, a carbazole-based derivative such as N-phenylcarbazole and polyvinylcarbazole, a fluorine-based derivative, N,N-bis(3-methylphenyl)-N,N'-diphenyl-[1,1-biphenyl]-4,4'-diamine (TPD), a triphenylamine derivative such as 4,4',4"-tris(N-carbazolyl)triphenylamine) (TCTA), N,N'-di(1-naphthyl)-N,N'diphenylbenzidine (NPB), and 4,4'-cyclohexylidene bis[N,N-bis(4-methylphenyl)benzenamine] (TAPC), but exemplary embodiments of the present invention are not limited to the aforementioned type of the hole transporting material.

The organic light emitting layer EML is disposed on the hole control layer HTR. The organic light emitting layer EML according to an exemplary embodiment of the present invention may emit blue light. In addition, the display device 10 according to an exemplary embodiment of the present invention may be top emission type. Accordingly, the blue light emitted from the organic light emitting layer EML may pass through the second electrode CE, and be incident to the color conversion panel 201 according to an exemplary embodiment of the present invention.

The electron control layer ETR may have a structure in which an electron transporting layer and an electron injecting layer are stacked. However, exemplary embodiments of the present invention are not limited thereto, and the electron injecting layer may be omitted.

The electron transporting layer may include an electron transporting material. The electron transporting material may include, for example, tris (8-hydroxyquinolinato) aluminum ($Alq_3$), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), 9,10-di(naphthalene-2-yl)anthracene (AND), and a mixture thereof. However, the type of the electron transporting material is not limited thereto.

The electron injecting layer may include an electron injecting material. The electron injecting material may include, for example, a lanthanum metal, such as LiF, lithium quinolate (LiQ), $Li_2O$, BaO, NaCl, CsF, and Yb, or a halogenated metal, such as RbCl and RbI. However, the type of the electron injecting layer is not limited thereto. For example, the electron injecting layer may include a mixture of an electron transporting material and an insulating organometallic salt. The organometallic salt may be a substance having an energy band gap of about 4 eV or more. For example, the organometallic salt may include metal acetate, metal benzoate, metal acetoacetate, metal acetylacetonate or metal stearate.

The second electrode CE is disposed on the organic light emitting layer EML. The second electrode CE may be semi-light transmissive or light transmissive In the case where the second electrode CE has semi-light transmitting characteristics, the second electrode CE may include Ag, Mg, Cu, Al, Pt, Pd, Au, Ni, Nd, Ir, Cr, Li, Ca, LiF/Ca, LiF/Al, Mo, and T1, or a compound or a mixture thereof (e.g., a mixture of Ag and Mg). In the case where the thickness of the second electrode CE is several tens to several hundreds of angstroms, the second electrode CE may have semi-light transmitting characteristics.

In the case where the second electrode CE has light transmitting characteristics, the second electrode CE may include transparent conductive oxide ("TCO"). For example, the second electrode CE may include tungsten oxide ($W_xO_x$), titanium oxide ($TiO_2$), indium tin oxide (ITO), indium zinc oxide (IZO), zinc oxide (ZnO), indium tin zinc oxide (ITZO), and magnesium oxide (MgO).

A thin film encapsulation layer TFE is disposed on the second electrode CE to seal the OLED. Accordingly, a gas or moisture that may be permeated toward the OLED is blocked by the thin film encapsulation layer TFE.

The thin film encapsulation layer TFE may include at least one inorganic layer CL1 and CL2 and at least one organic layer OL1 that are alternately arranged. For example, the thin film encapsulation layer TFE may include a first inorganic layer CL1, a first organic layer OL1, and a second inorganic layer CL2 that are sequentially stacked in the thickness direction of the substrate 110. However, the number of inorganic layers and the number of organic layers of the thin film encapsulation layer TFE are not limited thereto.

The color conversion panel 201 is disposed on the thin film encapsulation layer TFE of the display panel 101. The color conversion panel 201 includes a substrate 210, a light blocking layer 220, first and second color filters 230R and 230G, a low refractive index layer 240, first and second color conversion layers 250R and 250G, a light transmitting layer 250B, an inorganic layer 270, and a planarization layer 280.

The color conversion panel 201 is disposed so that the first color conversion layer 250R of the color conversion panel 201 is closer to the display panel 101 than the first color filter 230R is to the display panel 101. Accordingly, the light emitted from the OLED to the color conversion panel 201 may be emitted to the outside sequentially through the first color conversion layer 250R and the first color filter 230R.

The first color filter 230R and the first color conversion layer 250R of the color conversion panel 201 are disposed so as to overlap the first electrode AN of the OLED, and the light blocking layer 220 of the color conversion panel 201 may be disposed so as to overlap the pixel defining layer PDL.

Figure 10:
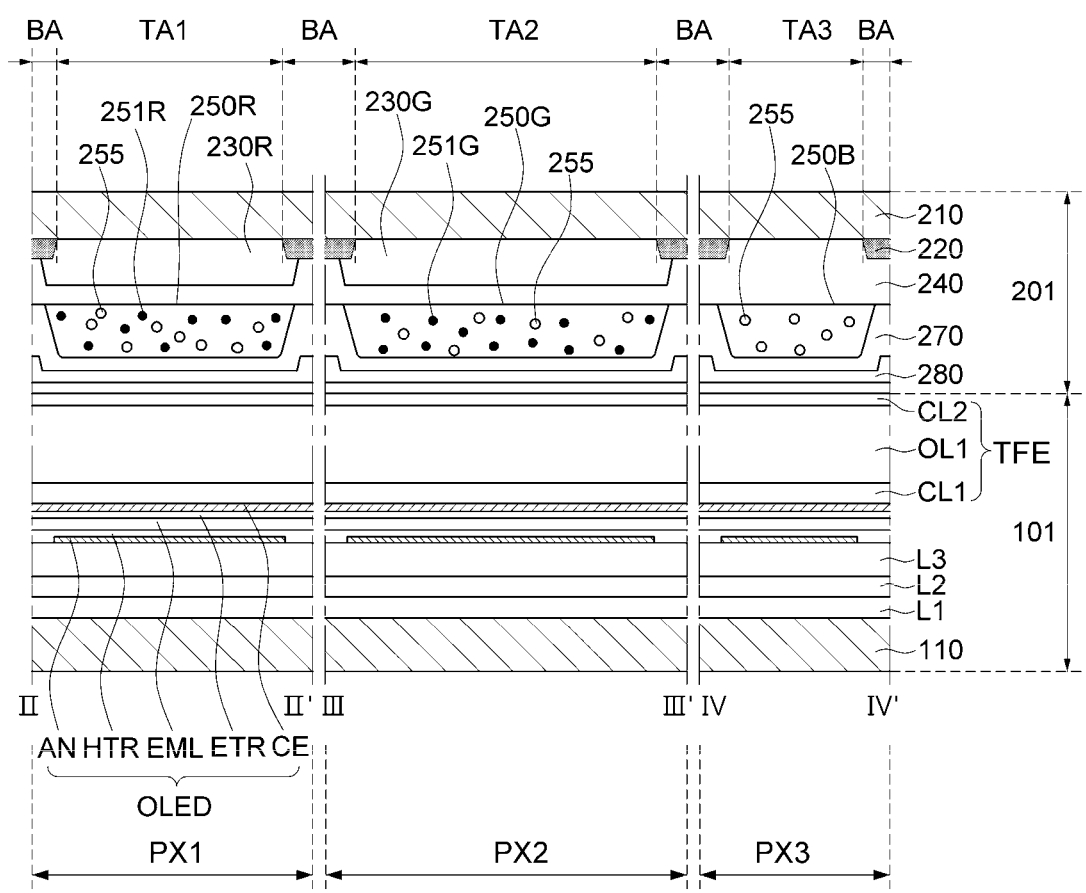
FIG. 10 is a cross-sectional view taken along lines II-II', and IV-IV' in FIG. 7.

FIG. 10 is a cross-sectional view taken along lines II-If, and IV-IV' in FIG. 7. In the description of FIG. 10, the components described above are denoted by the same reference numerals, and redundant description of the components will be omitted.

Referring to FIG. 10, the area of the first pixel PX1 which is a red pixel is less than the area of the second pixel PX2 which is a green pixel and larger than the area of the third pixel PX3 which is a blue pixel. More specifically, the area of each of the first color filter 230R and the first color conversion layer 250R is less than the area of each of the second color filter 230G and the second color conversion layer 250G and larger than the area of the light transmitting layer 250B. In addition, the first color filter 230R and the first color conversion layer 250R overlap the first electrode AN of the first pixel PX1, the second color filter 230G and the second color conversion layer 250G overlap the first electrode AN of the second pixel PX2, and the light transmitting layer 250B overlaps the first electrode AN of the third pixel PX3.

The first color filter 230R according to an exemplary embodiment of the present invention may have a transmittance higher than that of the second color filter 230G. For example, when the first and second color filters 230R and 230G have the same thickness, the first color filter 230R may have a transmittance in the range from about 75% to about 95%, and the second color filter 230G may have a transmittance in the range from about 65% to about 75%. Accordingly, the external light reflectance in the first transmission area TA1 at which the first color filter 230R is disposed may be higher than the external light reflectance in the second transmission area TA2 at which the second color filter 230G is disposed. That is, the first transmission area TA1 at which the red color filter is disposed may have an external light reflectance higher than that of the second transmission area TA2 at which the green color filter is disposed.

In addition, the second color conversion layer 250G according to an exemplary embodiment of the present invention includes a less amount of the scattering element 255 than the amount of the scattering element 255 included in the first color conversion layer 250R. The first color conversion layer 250R includes the scattering element 255 in the amount ranging from about 4 wt % to about 15 wt % with respect to the total weight of the first color conversion layer 250R, and the second color conversion layer 250G includes the scattering element 255 in the amount ranging from about 2 wt % to about 7 wt % with respect to the total weight of the second color conversion layer 250G. For example, the first color conversion layer 250R may include the scattering element 255 in the amount of about 11 wt % with respect to the total weight of the first color conversion layer 250R, and the second color conversion layer 250G may include the scattering element 255 in the amount of about 4.5 wt % with respect to the total weight of the second color conversion layer 250G.

The scattering element 255 included in the first and second color conversion layers 250R and 250G may reflect external light to lower the contrast ratio. The second color conversion layer 250G according to an exemplary embodiment of the present invention includes a less amount of the scattering element 255 than the amount of the scattering element 255 included in the first color conversion layer 250R so that the external light reflectance per unit area at the second color conversion layer 250G may be less than the external light reflectance per unit area at the first color conversion layer 250R. In other words, the external light reflectance at the first color conversion layer 250R which is a red color conversion layer is higher than the external light reflectance at the second color conversion layer 250G which is a green color conversion layer.

In addition, the light transmitting layer 250B according to an exemplary embodiment of the present invention includes the scattering element 255 and a blue pigment. In particular, the display device 10 according to an exemplary embodiment of the present invention does not include a separate blue color filter. Accordingly, the external light reflectance in the third transmission area TA3 may increase as compared with the case in which the blue color filter is provided.

When first, second, and third pixels PX1, PX2 and PX3 having different light emission areas are included, the contrast ratio due to the external light may be lowered. In particular, since the light emission area of the second pixel PX2 which is a green pixel is large, a greenish phenomenon may occur whereby a greenish black color is viewed due to reflection of external light or a greenish white color is viewed when implementing a white color.

However, since the display device 10 according to an exemplary embodiment of the present invention includes the first color filter 230R which is a red color filter having a transmittance higher than that of the second color filter 230G which is a green color filter, and includes the first color conversion layer 250R which is a red color conversion layer having a reflectance higher than that of the second color conversion layer 250G which is a green color conversion layer, without including a blue color filter, the greenish phenomenon in which a greenish black color is viewed due to reflection of external light or a greenish white color is viewed when implementing a white color may be substantially prevented. Accordingly, the color purity of the display device 10 may be improved, and the display quality may be improved.

Figure 11:
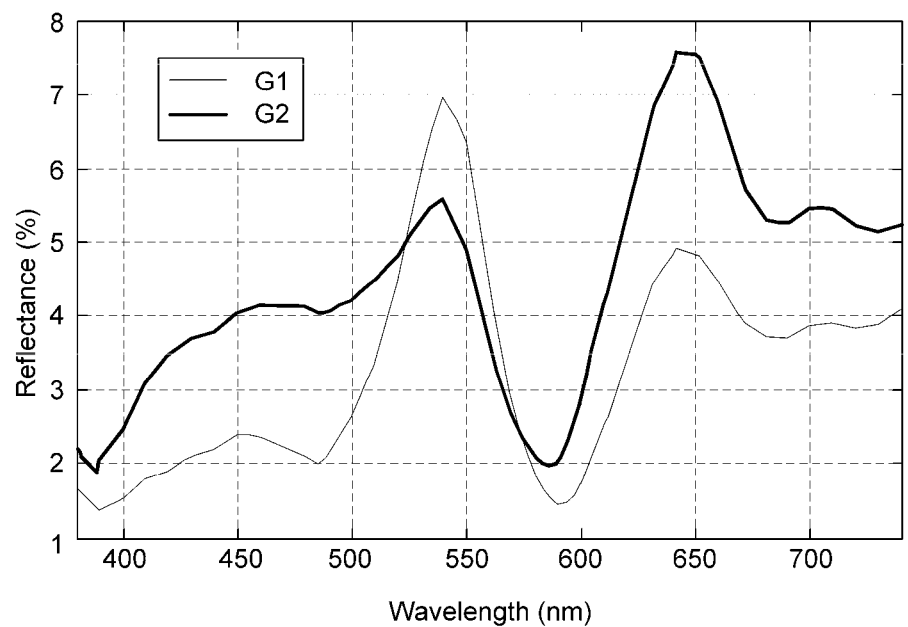
FIG. 11 is a graph showing reflectance, according to wavelength, of a display device according to an exemplary embodiment of the present invention.

FIG. 11 is a graph showing reflectance, according to wavelength, of a display device according to an exemplary embodiment of the present invention. Herein, a graph G1 in FIG. 11 is a comparative graph for comparison with an exemplary embodiment of the present invention, and a graph G2 is a graph according to an exemplary embodiment of the present invention.

More specifically, the graph G1 in FIG. 11 shows the reflectance, according to wavelength, of a display device in which first and second color conversion layers 250R and 250G include substantially equal amounts of scattering elements, and a blue color filter is disposed at the third transmission area TA3. In addition, the graph G2 in FIG. 11 shows the reflectance, according to wavelength, of a display device according to an exemplary embodiment of the present invention in which the second color conversion layer 250G includes a less amount of the scattering element 255 than the amount of the scattering element 255 included in the first color conversion layer 250R, and the blue color filter is not provided.

Referring to FIG. 11, according to an exemplary embodiment of the present invention, each of the reflectance of blue light having a wavelength ranging from about 450 nm to about 495 nm and the reflectance of red light having a wavelength ranging from about 620 nm to about 780 nm increases, and the reflectance of green light having a wavelength ranging from about 495 nm to about 570 nm is decreased.

Figure 12:
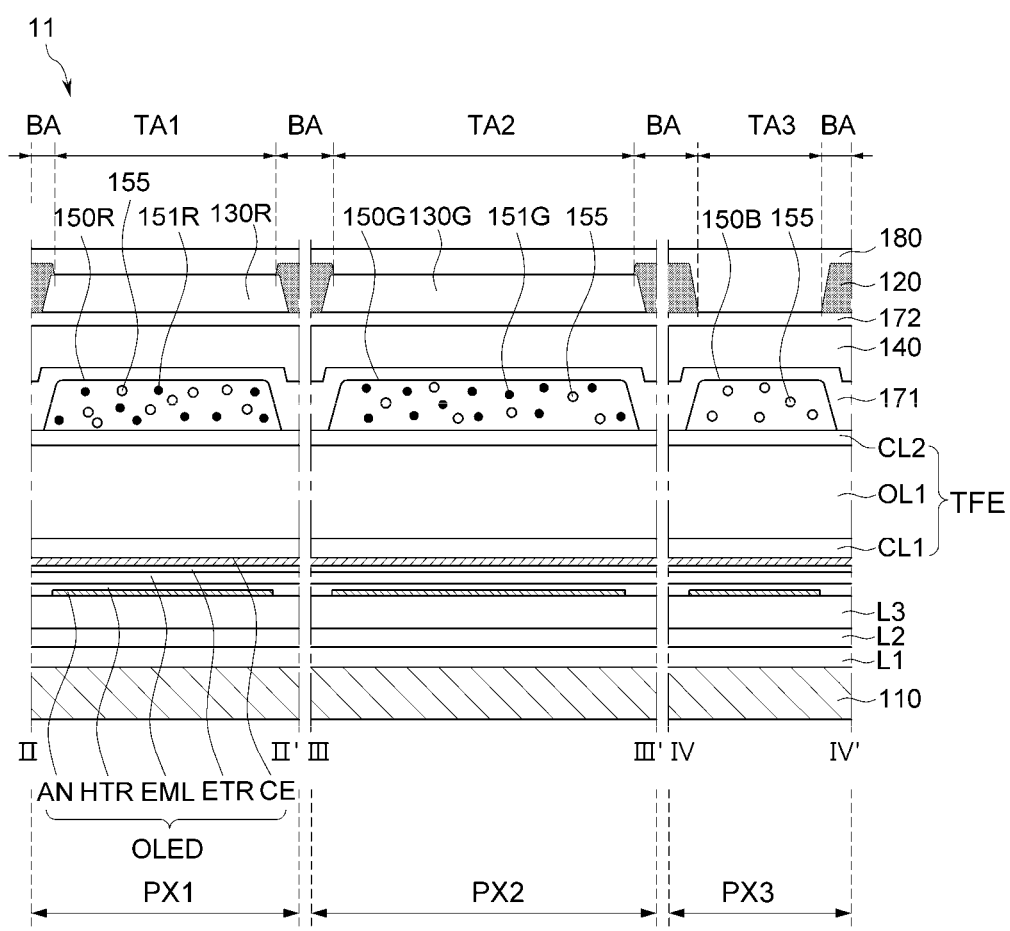
FIG. 12 is a cross-sectional view illustrating a display device according to another exemplary embodiment of the present invention.

Hereinafter, a display device 11 according to another exemplary embodiment of the present invention will be described with reference to FIG. 12. The description of the same configuration as that of an exemplary embodiment of the present invention will be omitted for the convenience of explanation. FIG. 12 is a cross-sectional view illustrating a display device according to another exemplary embodiment of the present invention.

Referring to FIG. 12, a display device 11 according to another exemplary embodiment of the present invention includes a single panel, which is different to the display device 10 according to an exemplary embodiment of the present invention in which the separate display panel 101 and the color conversion panel 201 are attached together.

That is, first and second color conversion layers 150R and 150G, a light transmitting layer 150B, a first inorganic layer 171, a low refractive index layer 140, a second inorganic layer 172, first and second color filters 130R and 130G, a light blocking layer 120, and a planarization layer 180 may be sequentially stacked on a thin film encapsulation layer TFE. Accordingly, the first and second color conversion layers 150R and 150G and the light transmitting layer 150B are formed on the substrate 110 before the low refractive index layer 140 and the first and second color filters 130R and 130G are formed thereon.

The low refractive index layer 140 may be disposed between the first inorganic layer 171 and the second inorganic layer 172, and over the entire surface of the substrate 110. The low refractive index layer 140 may have a refractive index less than those of the first and second color conversion layers 150R and 150G and the light transmitting layer 150B. Accordingly, the color conversion efficiency of the display device 11 may be improved.

In addition, the first and second color filters 130R and 130G are formed on the substrate 110 before the light blocking layer 120 is formed on the substrate 110, and the planarization layer 180 is disposed on the first and second color filters 130R and 130G and the light blocking layer 120. In such an exemplary embodiment, the planarization layer 180 may seal the constituent elements in the display device 11 so as to substantially prevent penetration of gas, water, or the like into the display device 11.

The display device 11 according to another exemplary embodiment of the present invention may simplify the manufacturing process by omitting the process of forming a separate panel and then joining them together, and the display device 11 may achieve thinness.

Figure 13:
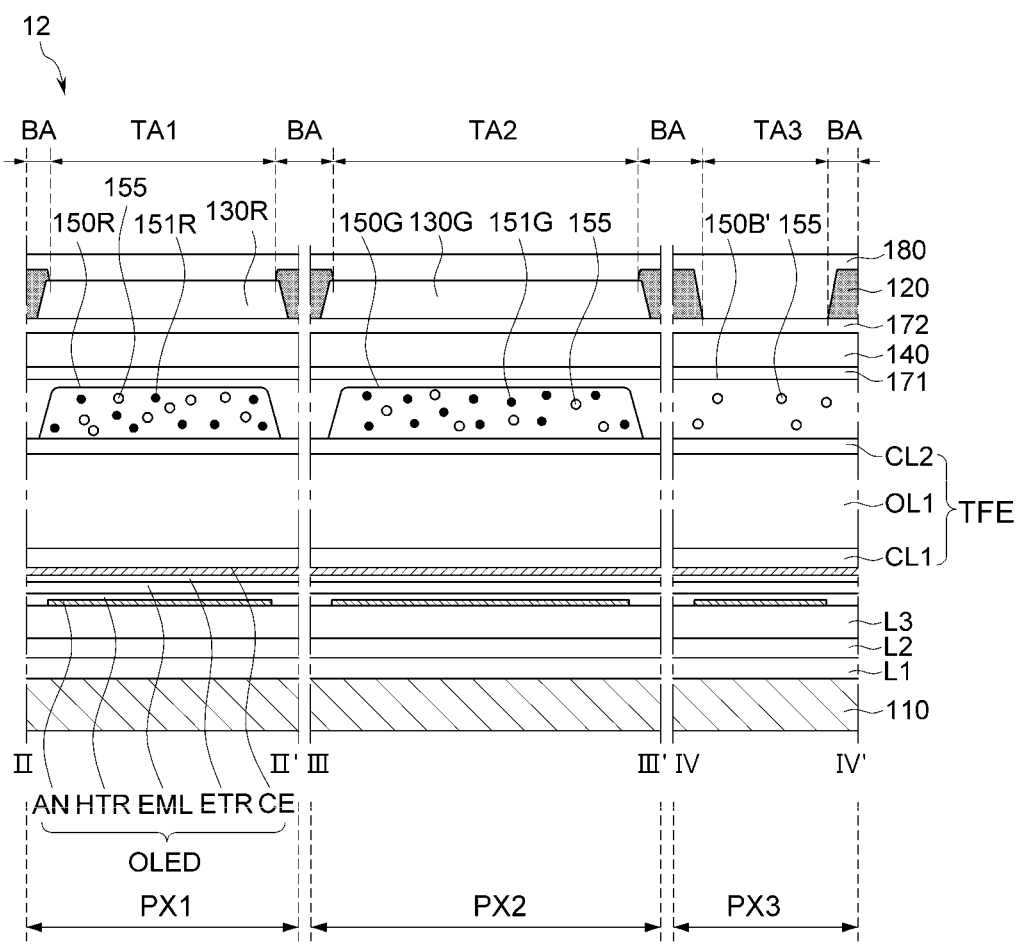
FIG. 13 is a cross-sectional view illustrating a display device according to still another exemplary embodiment of the present invention.

Hereinafter, a display device 12 according to still another exemplary embodiment of the present invention will be described with reference to FIG. 13. The description of the same configuration as that of an exemplary embodiment of the present invention will be omitted for the convenience of explanation. FIG. 13 is a cross-sectional view illustrating a display device 12 according to still another exemplary embodiment of the present invention.

Referring to FIG. 13, a display device 12 according to still another exemplary embodiment of the present invention includes a light transmitting layer 150B' disposed at a light blocking area BA and first, second, and third light transmission areas TA1, TA2, and TA3. That is, the light transmitting layer 150B' may be disposed over the entire surface of a substrate 110, and may cover first and second color conversion layers 150R and 150G.

The light transmitting layer 150B' according to still another exemplary embodiment of the present invention has a thickness that is greater than a thickness of the first and second color conversion layers 150R and 150G, which is different to an exemplary embodiment of the present invention in which the light transmitting layer 150B' has a thickness substantially equal to the thickness of the first and second color conversion layers 150R and 150G.

The display device 12 according to still another exemplary embodiment of the present invention does not require a separate process for patterning the light transmitting layer 150B'. Accordingly, a photolithography process using a mask may be omitted once, and the process of manufacturing the display device 12 may be simplified.

As set forth hereinabove, the color conversion panel according to one or more exemplary embodiments and the display device including the color conversion panel may improve the display quality by including the low refractive index layer disposed over the entire surface of the substrate, and the first and second color conversion layers each including different amounts of scattering elements.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A color conversion panel, comprising:
    a substrate comprising a light blocking area and a first transmission area, a second transmission area, and a third transmission area;
    a first color filter disposed on the substrate in the first transmission area;
    a second color filter disposed on the substrate in the second transmission area;
    a low refractive index layer disposed on the substrate and the first and second color filters in the light blocking area and the first, second, and third transmission areas;
    a first color conversion layer disposed on the low refractive index layer above the first color filter;
    a second color conversion layer disposed on the low refractive index layer above the second color filter; and
    a light transmitting layer disposed on the low refractive index layer in the third transmission area,
    wherein:
    the low refractive index layer has a refractive index lower than a refractive index of the first color conversion layer and a refractive index of the second color conversion layer; and
    a color filter is absent in the third transmission area.

2. The color conversion panel of claim 1, wherein the low refractive index layer has a refractive index in a range from about 1.1 to about 1.3.

3. The color conversion panel of claim 1, wherein an area of the first transmission area is less than an area of the second transmission area and larger than an area of the third transmission area.

4. The color conversion panel of claim 1, wherein the first color filter is a red color filter,
    the second color filters is a green color filter, and
    each of the first and second color conversion layers comprises phosphors and scattering elements.

5. The color conversion panel of claim 4, wherein the second color conversion layer comprises an amount of scattering elements less than an amount of the scattering elements in the first color conversion layer.

6. The color conversion panel of claim 5, wherein the second color conversion layer comprises:
    phosphors in the amount ranging from about 40 wt % to about 55 wt % with respect to a total weight of the second color conversion layer; and
    scattering elements in the amount ranging from about 2 wt % to about 7 wt % with respect to the total weight of the second color conversion layer.

7. The color conversion panel of claim 4, wherein the first color filter has a transmittance higher than a transmittance of the second color filter.

8. The color conversion panel of claim 7, wherein the first color filter has a transmittance in a range from about 75% to about 95%, and
    the second color filter has a transmittance in a range from about 65% to about 75%.

9. The color conversion panel of claim 4, wherein the first color filter has a thickness less than a thickness of the second color filter.

10. The color conversion panel of claim 9, wherein a thickness of the low refractive index layer in the first transmission area is greater than a thickness of the low refractive index layer in the second transmission area and less than a thickness of the low refractive index layer in the third transmission area.

11. The color conversion panel of claim 1, wherein the light transmitting layer further comprises scattering elements.

12. The color conversion panel of claim 1, wherein the light transmitting layer further comprises a blue pigment.

13. The color conversion panel of claim 1, further comprising an inorganic layer disposed between the low refractive index layer and the first and second color conversion layers.

14. The color conversion panel of claim 1, wherein the light transmitting layer covers the first and second color conversion layers.

15. The color conversion panel of claim 1, further comprising a light blocking layer disposed on the substrate in the blocking area,
wherein at least a part of the first and second color filters overlaps with the light blocking layer.

16. A display device, comprising:
a display panel; and
a color conversion panel overlapping the display panel, wherein the color conversion panel comprises:
a substrate comprising a light blocking area and a first transmission area, a second transmission area, and a third transmission area;
a first color filter disposed on the substrate in the first transmission area;
a second color filter disposed on the substrate in the second transmission area;
a low refractive index layer disposed on the substrate and the first and second color filters in the light blocking area and the first, second, and third transmission areas;
a first color conversion layer disposed on the low refractive index layer above the first color filter;
a second color conversion layer disposed on the low refractive index layer above the second color filter; and
a light transmitting layer disposed on the low refractive index layer in the third transmission area, and
wherein:
the low refractive index layer has a refractive index lower than a refractive index of the first color conversion layer and a refractive index of the second color conversion layer; and
a color filter is absent in the third transmission area.

17. The display device of claim 16, wherein the display panel comprises an organic light emitting element, and
wherein the organic light emitting element comprises:
a first electrode;
an organic light emitting layer disposed on the first electrode and emitting blue light; and
a second electrode disposed on the organic light emitting layer.

18. A display device, comprising:
a substrate comprising a light blocking area and a first transmission area, a second transmission area, and a third transmission area;
organic light emitting elements disposed on the substrate at each of the first, second, and third transmission areas;
a thin film encapsulation layer disposed on the organic light emitting element;
a first color conversion layer disposed on the thin film encapsulation layer in the first transmission area;
a second color conversion layer disposed on the thin film encapsulation layer in the second transmission area;
a light transmitting layer disposed on the thin film encapsulation layer in the third transmission area;
a low refractive index layer disposed on the first color conversion layer, the second color conversion layer, and the light transmitting layer;
a first color filter disposed directly on the low refractive index layer above the first color conversion layer; and
a second color filter disposed directly on the low refractive index layer above the second color conversion layer,
wherein:
the low refractive index layer has a refractive index lower than a refractive index of the first color conversion layer and a refractive index of the second color conversion layer; and
a color filter is absent in the third transmission area.

19. The display device of claim 18, wherein the low refractive index layer is disposed between a first inorganic layer and a second inorganic layer.

20. The display device of claim 18, wherein the light transmitting layer covers the first and second color conversion layers.

* * * * *